United States Patent
Van Bommel et al.

(10) Patent No.: US 11,739,888 B2
(45) Date of Patent: Aug. 29, 2023

(54) TUNABLE LED FILAMENT

(71) Applicant: SIGNIFY HOLDING B.V., Eindhoven (NL)

(72) Inventors: Ties Van Bommel, Horst (NL); Rifat Ata Mustafa Hikmet, Eindhoven (NL); Johannes Petrus Maria Ansems, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 17/908,489

(22) PCT Filed: Feb. 26, 2021

(86) PCT No.: PCT/EP2021/054814
§ 371 (c)(1),
(2) Date: Aug. 31, 2022

(87) PCT Pub. No.: WO2021/175711
PCT Pub. Date: Sep. 10, 2021

(65) Prior Publication Data
US 2023/0099125 A1    Mar. 30, 2023

(30) Foreign Application Priority Data
Mar. 2, 2020 (EP) ..................................... 20160304

(51) Int. Cl.
*F21K 9/232* (2016.01)
*F21K 9/68* (2016.01)
(Continued)

(52) U.S. Cl.
CPC ............... *F21K 9/232* (2016.08); *F21K 9/68* (2016.08); *F21Y 2103/10* (2016.08); *F21Y 2113/13* (2016.08); *F21Y 2115/10* (2016.08)

(58) Field of Classification Search
CPC ........ F21K 9/232; F21K 9/68; F21Y 2103/10; F21Y 2113/13; F21Y 2115/10
See application file for complete search history.

(56) References Cited

U.S. PATENT DOCUMENTS 11,187,387 B1 * 11/2021 Yan .......................... F21K 9/238
2012/0014111 A1    1/2012 Welten
(Continued)

FOREIGN PATENT DOCUMENTS

| CN | 207407096 U | 5/2018 |
|----|-------------|--------|
| JP | 2012099726 A | 5/2012 |

(Continued)

*Primary Examiner* — Tracie Y Green

(57) ABSTRACT

The present invention relates to a color tunable and/or color temperature tunable LED filament (20, 22, 24), said LED filament comprising an elongated carrier (220), said elongated carrier comprising a first major surface (222) and a second major surface (224) arranged opposite to said first major surface, a plurality of LEDs (210) arranged in at least one linear array on said first surface of said elongated carrier, wherein the plurality of LEDs includes LEDs of different colors and/or different color temperatures, a first elongated transparent or substantially transparent layer (230) covering the plurality of LEDs on the first major surface and also at least partly covering said first major surface, and a first elongated light scattering layer (240), arranged to at least partially cover said first transparent or substantially transparent layer.

13 Claims, 7 Drawing Sheets

(51) Int. Cl.
    *F21Y 113/13*    (2016.01)
    *F21Y 103/10*    (2016.01)
    *F21Y 115/10*    (2016.01)

(56)         References Cited

U.S. PATENT DOCUMENTS

| | | |
|---|---|---|
| 2013/0194797 A1 | 8/2013 | Jackson |
| 2013/0235593 A1 | 9/2013 | Takeuchi et al. |
| 2017/0012177 A1 | 1/2017 | Trottier |
| 2017/0130906 A1 | 5/2017 | Jiang et al. |
| 2017/0241598 A1 | 8/2017 | Jiang et al. |
| 2017/0314740 A1 | 11/2017 | Marinus et al. |
| 2017/0328523 A1 | 11/2017 | Tanda et al. |
| 2018/0094777 A1 | 4/2018 | Vargas-Chambers |
| 2018/0216787 A1 | 8/2018 | Chung et al. |
| 2019/0128481 A1 | 5/2019 | Chowdhury et al. |
| 2019/0189874 A1 | 6/2019 | Bösl et al. |

FOREIGN PATENT DOCUMENTS

| | | |
|---|---|---|
| JP | 2013522850 A | 6/2013 |
| JP | 2014026988 A | 2/2014 |

\* cited by examiner

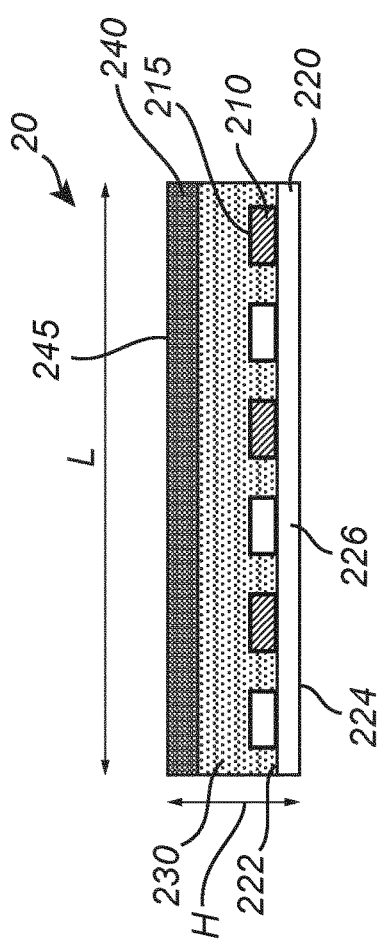
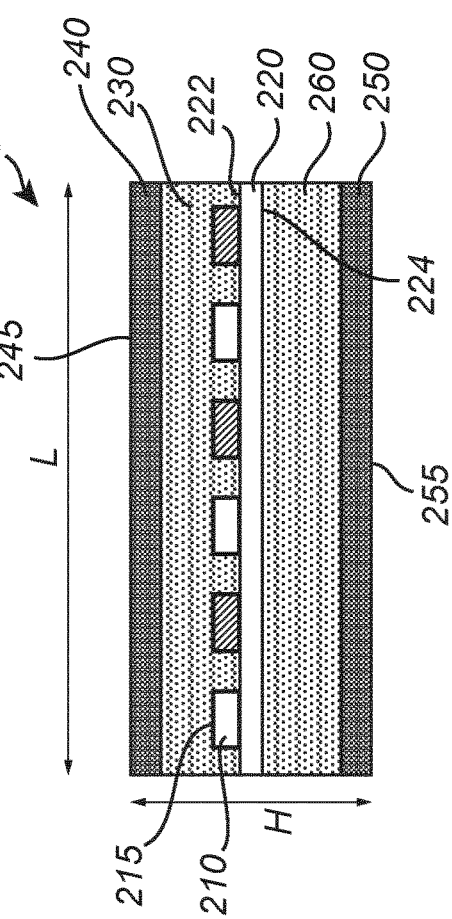
Fig. 2b
Fig. 3b
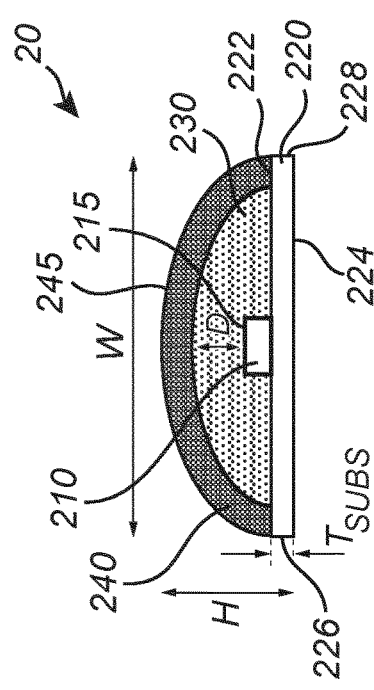
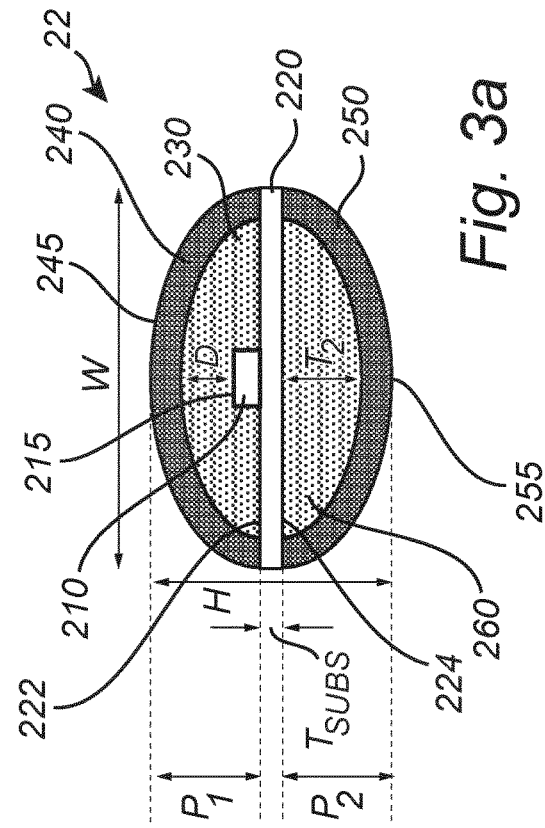
Fig. 2a
Fig. 3a

TUNABLE LED FILAMENT

CROSS-REFERENCE TO PRIOR APPLICATIONS

This application is the U.S. National Phase application under 35 U.S.C. § 371 of International Application No. PCT/EP2021/054814, filed on Feb. 26, 2021, which claims the benefit of European Patent Application No. 20160304.0, filed on Mar. 2, 2020. These applications are hereby incorporated by reference herein.

FIELD OF THE INVENTION

The present invention relates to a color tunable and/or color temperature tunable LED filament. The present invention also relates to a retrofit light bulb comprising at least one such LED filament.

BACKGROUND OF THE INVENTION

Incandescent lamps are rapidly being replaced by LED (light emitting diode) based lighting solutions. It is nevertheless appreciated and desired by users to have retrofit lamps which have the look of an incandescent bulb. For this purpose, one can simply make use of the infrastructure for producing incandescent lamps based on glass and replace the filament with LEDs emitting white light. The appearances of these lamps are highly appreciated as they look highly decorative.

An example of an LED filament is disclosed in US20170130906A1 (FIG. 26), in which a tubular enclosure has exactly one unitary layer over an LED device. Light scattering particles are dispersed in the (wavelength conversion) layer throughout a binder material along with nanoparticles and phosphor particles. According to US20170130906A1, index-matching the binder material with the phosphor particles reduces scattering within the wavelength conversion layer, which adversely affects the uniformity of the color temperature distribution in the LED filament, whereby the light scattering particles serve to mitigate this negative effect.

SUMMARY OF THE INVENTION

Current LED filament lamps are not color controllable. For producing LED filament lamps with a color and/or color temperature control one can make use of RGB or CW-WW LEDs on a translucent (e.g. transparent) substrate. However, for a nice appearance it is desired to have good color mixing and/or improved light distribution.

It is an object of the present invention to overcome the above-mentioned problem.

According to a first aspect of the invention, this and other objects are achieved by a color tunable and/or color temperature tunable light emitting diode (LED) filament, the LED filament comprising: an elongated carrier, the elongated carrier comprising a first major surface and a second major surface arranged opposite to the first major surface, a plurality of LEDs arranged in at least one linear array on the first surface of the elongated carrier, wherein the plurality of LEDs includes LEDs of different colors and/or different color temperatures, a first elongated transparent or substantially transparent layer covering the plurality of LEDs on the first surface and also at least partly covering the first major surface, and a first elongated light scattering layer, arranged to at least partially cover the first transparent or substantially transparent layer.

The present invention is based on the understanding that the first (substantially) transparent layer and the first elongated light scattering layer may serve the purpose of a mixing chamber on the LED filament level, in which mixing chamber light of different colors and/or different color temperatures may be mixed, to achieve emission of light that may be omni-directional and homogeneous. This in turn means that a color and/or color temperature tunable LED filament lamp with uniform appearance can be obtained.

The exterior surface of the first elongated light scattering layer may be regarded as the first exiting surface of the LED filament. Furthermore, the first elongated transparent or substantially transparent layer may define an inner volume of the aforementioned mixing chamber. The term 'substantially transparent layer' may here be construed as the layer having a reflectance of less than 8% or less than 5%.

According to an embodiment of the LED filament, the second major surface of the elongated carrier is at least partially covered by a second elongated transparent or substantially transparent layer, the second elongated transparent layer having a thickness $T_2$, wherein a second elongated light scattering layer is arranged to at least partially cover said second elongated transparent or substantially transparent layer. This may provide for symmetric emission. The exterior surface of the second elongated light scattering layer may form a second exit window of the LED filament.

$T_2$ may be in the range of 0.5 to 5 mm, preferably in the range of 0.8 to 4 mm, and more preferably in the range of 1 to 3 mm.

According to another embodiment of the LED filament, the second major surface of the elongated carrier is at least partially covered by a second elongated light scattering layer, whereby the aforementioned second elongated (substantially) transparent layer is omitted. This may lead to a more compact LED filament while still providing useful mixing.

The first (and second) elongated transparent or substantially transparent layer and the first (and second) elongated light scattering layer can be made of a polymer, for example silicone, with high thermal and optical properties. Furthermore, the first (and second) elongated transparent or substantially transparent layer and the first (and second) elongated light scattering layer can be flexible. Furthermore, the first elongated (and second) light scattering layer may comprise scattering particles, such as to $Al_2O_3$, $BaSO_4$, $TiO_2$, or silicone particles. The scattering particles may be arranged in a matrix, preferably a polymer matrix such as, but not limited to, silicone. The layers can for example be applied by suspending/printing techniques or by dip coating or spraying techniques.

Furthermore, the present LED filament could have a circular or elliptical cross-section (e.g. the embodiment with the second elongated transparent or substantially transparent layer and the second elongated light scattering layer), or a semi-circular or semielliptical (in particular divided along the major axis) cross-section (e.g. an embodiment without the second elongated transparent or substantially transparent layer). The circular cross section may be aesthetically more preferable.

The elongated carrier may be translucent, preferably transparent. In this way, light emitted by the LEDs and reflected back by the first elongated light scattering layer could pass through the elongated carrier next to the LEDs and exit the LED filament on its backside (e.g. though the aforementioned second major surface of the elongated carrier or though the aforementioned second exit window). The (transparent) elongated carrier can for example be made of glass, sapphire, quartz, ceramic material, or alternatively, polymer such as poly imide (PI).

Furthermore, the elongated carrier can be rigid (for example made by glass, sapphire, or quartz) or flexible (e.g. a foil).

A maximum distance D between a light output surface of the plurality of LEDs and the first elongated light scattering layer (in the normal direction of said first major surface of said elongated carrier) may be in the range of 0.5 to 5 mm, preferably in the range from 0.8 to 4 mm, and more preferably in the range from 1 to 3 mm. In other words, D represents the (maximum) thickness of the first elongated (substantially) transparent layer from the LEDs' light output surfaces to where the first elongated light scattering layer begins. Larger values of D on the one hand may further improve light mixing, while on the other hand, drive the appearance of the filament away from typical filaments. Similarly, smaller values of D may bring the aesthetics of the LED filament closer to that of conventional filaments, while reducing its mixing efficiency. While D generally should be larger than zero, the obtained effect of the above-mentioned ranges is an optimum with respect to improved mixing and mimicking a filament (of an incandescent lamp).

Color control as well as color and color temperature control of the present LED filament can be achieved with RGB LEDs. Color temperature control can also be achieved with cool(er) white LEDs and warm(er) white LEDs. The present LED filament could also include both RGB and white LEDs. It is notable that the more the variety e.g. different color and/or color temperature of LEDs used within a filament, the better the mixing may need to be. This may be accomplished by, for instance increasing the thickness of the transparent layer(s) (larger D, and $T_2$), and/or increasing the reflectivity of the scattering layer(s).

According to an embodiment of the LED filament, the plurality of LEDs includes green LEDs, red LEDs, and blue LEDs, wherein the plurality of LEDs are arranged in three linear arrays which are parallel and individually addressable, and wherein one of the three parallel and linear arrays contains the green LEDs, another one of the three parallel and linear arrays contains the red LEDs, and a third of the three parallel and linear arrays contains the blue LEDs. This provides for a low-cost design.

According to another embodiment of the LED filament, the plurality of LEDs includes green LEDs, red LEDs, and blue LEDs arranged alternately in a single linear array, wherein the green LEDs provide a green channel, wherein red LEDs provide a red channel, wherein the blue LEDs provide a blue channel, and wherein the green, red and blue channels are individually addressable. This provides for improved color mixing, because all LEDs may be symmetrically and centrally arranged (widthwise) in the mixing chamber formed at least by the first (substantially) transparent layer and the first elongated light scattering layer. The different LEDs may here be electrically connected using for example jumpers or a double Cu layer for connecting the same color LEDs to one another.

The number of green LEDs (per filament) is preferably at least five, more preferably at least eight, and most preferably at least ten. The number of red LEDs (per filament) is preferably at least five, more preferably at least eight, and most preferably at least ten. The number of blue LEDs (per filament) is preferably at least five, more preferably at least eight, and most preferably at least ten. Furthermore, on the filament, the number of green LEDs, red LEDs, and blue LEDs may be equal. The LED filament may for example have ten green LEDs, ten red LEDs, and ten blue LEDs.

According to yet another embodiment of the LED filament, the plurality of LEDs includes cool(er) white LEDs and warm(er) white LEDs arranged alternately in a single linear array, wherein the cool white LEDs provide a cool white channel, wherein the warm white LEDs provide a warm white channel, and wherein the cool white and warm white channels are individually addressable. Similar to the previously mentioned embodiment, this provides for improved color (temperature) mixing, because all LEDs may be symmetrically and centrally arranged in the mixing chamber. The color temperature of the cool white LEDs is preferably more than 2700K, more preferably more than 3000K, most preferably more than 3300K. The color temperature of the warm white LEDs is preferably less than 2500K, more preferably less than 2300K, most preferably less than 2200K.

The first elongated light scattering layer may have a reflectance in the range of 30% to 90%, preferably in the range of 50% to 90%, and more preferably in the range of 60% to 90%. This may provide for good color mixing, preventing spottiness, while obtaining a good efficiency.

The first elongated light scattering layer may have an angular gradient in reflectance such that the reflectance is highest in a portion of the first elongated light scattering layer being substantially parallel to said first major surface of the elongated carrier. In other words, the reflectance may be higher at a top/distal portion of the first elongated light scattering layer than at side portions of the first elongated light scattering layer, seen transversely to the longitudinal direction of the LED filament. In case the LED filament has an elliptical or semielliptical cross-section, the portion with highest reflectance could be at the (upper) vertex, whereas the side portions with low(er) reflectance could be at the so-called co-vertexes. Since light from the LEDs emitted substantially normal to the light output surface may have a higher intensity in comparison to light emitted in other angular directions, it may be useful to have the aforementioned angular gradient in reflectance, in order to achieve a more effective light mixing and better all-around homogeneous light distribution.

The first elongated light scattering layer may have a higher reflectance than the second elongated light scattering layer. This may lead to improved color and/or color temperature mixing and symmetric emission. The reason is that first elongated light scattering layer receives direct light from the LEDs, while the second elongated light scattering layer receives indirect light of the LEDs (i.e. light that has be scattered/reflected by the first elongated light scattering layer). The difference in reflectivity of the first and second elongated light scattering layers may for example be achieved by increasing the concentration of scattering particles in the first elongated light scattering layer compared to the second elongated light scattering layer and/or by increasing the thickness of the first elongated light scattering layer compared to the second elongated light scattering layer and/or by using scattering particles with higher reflectivity in the first elongated light scattering layer compared to the second elongated light scattering layer. The difference in reflectance of the first and second scattering layers may preferably be at least 20%, more preferably at least 30%, most preferably at least 40%. The second elongated light scattering layer may for example have a reflectance in the range of 8% to 35%, preferably in the range of 10% to 32%, and more preferably in the range of 12 to 30%.

The first elongated light scattering layer and the second elongated light scattering layer may form a single all-around light scattering layer. Here the rest of the LED filament, including longitudinal side surfaces of the elongated carrier, may be completely surrounded by this single (tubular) all-around scattering layer.

The aforementioned maximum distance D may be greater than the thickness $T_2$ of the second elongated transparent or substantially transparent layer, Preferably, $2*T_2 > D > 1.2*T_2$. The obtained effect is improved color mixing and symmetric emission. The reason is that the (transparent) elongated substrate may optically be part of the second transparent or substantially transparent layer.

Furthermore, a maximum normal distance $P_1$ from the first major surface of the elongated carrier to the exterior surface of the first elongated light scattering layer may at least 1.5 times the maximum normal distance $P_2$ from the second major surface of the elongated carrier to the exterior surface of the second elongated light scattering layer. This may compensate for the fact that the (transparent) elongated substrate may optically be part of the second transparent or substantially transparent layer, in case they have the same or similar refractive indices.

According to a second aspect of the invention, there is provided a retrofit light bulb, comprising at least one LED filament according to the first aspect a transmissive envelope at least partly surrounding the LED filament(s), a controller electrically connected to the at least one LED filament, and a connector for electrically and mechanically connecting said light bulb to a socket.

It is noted that the invention relates to all possible combinations of features recited in the claims.

BRIEF DESCRIPTION OF THE DRAWINGS

These and other aspects of the present invention will now be described in more detail, with reference to the appended drawings showing embodiment(s) of the invention.

FIGS. 2a and 2b demonstrate cross sectional views of an LED filament comprising first transparent and scattering layers.

FIGS. 3a and 3b demonstrate cross sectional views of an LED filament comprising first transparent and scattering layers, and second transparent and scattering layers.

As illustrated in the figures, the sizes of layers and regions may be exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
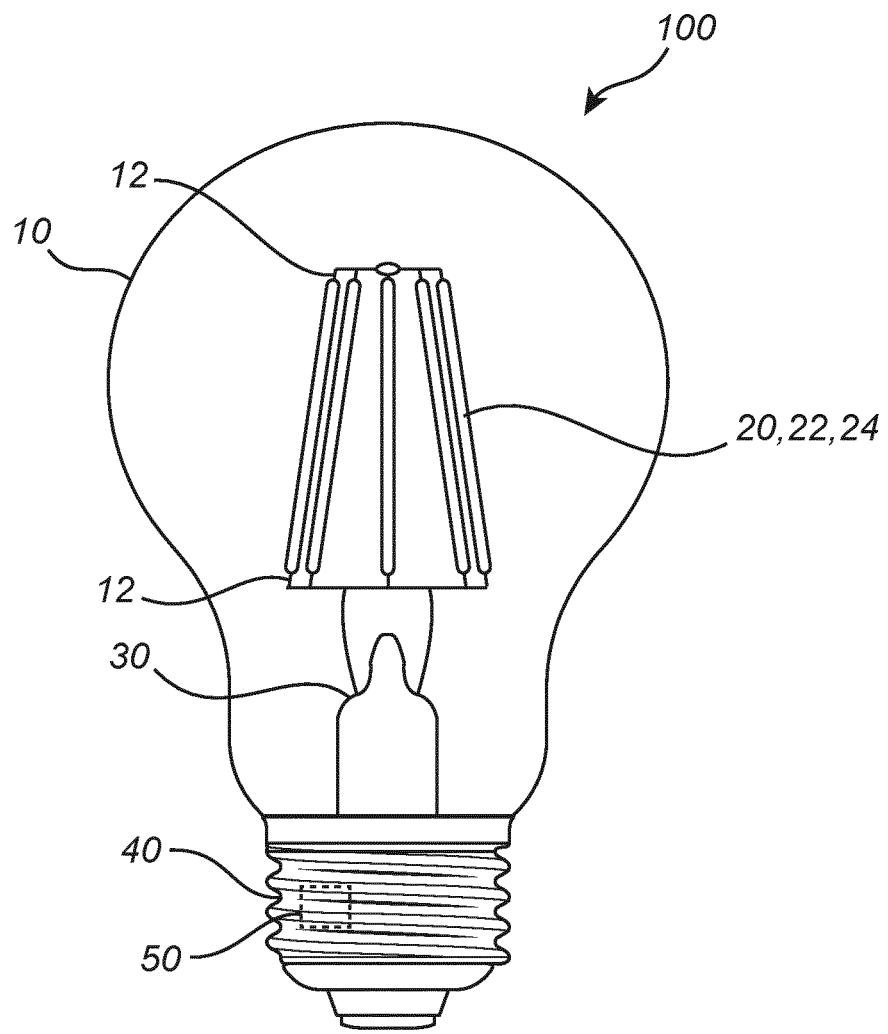
FIG. 1 demonstrates a side view of a retrofit light bulb including a plurality of LED filaments accommodated within an envelope.

FIG. 1 demonstrates a retrofit light bulb 100 including a plurality of LED filaments 20, 22, 24 accommodated within an envelope 10. The LED filaments 20, 22, 24 (explained in more detail below) are connected to a controller 50, and an electrical (and mechanical) connector 40, through their connecting ends 12 and the connecting wires 30. Similar to the typical incandescent light bulbs, here in FIG. 1, the light bulb 100 comprises an electrical connector 40, here a threaded Edison connector such E26 or E27, in order to connect the lamp 10 to an electric socket (not shown). Note that in this text, retrofit light bulb and lamp are used to refer to the same object, and may be used interchangeably unless noted otherwise.

The LED filament 20, 22, 24 may be configured to emit white light, or light with any other color or spectrum. The LED filament 20, 22, 24 may also be configured to be color tunable and/or color temperature tunable (in case of white light). More details on the latter will follow later in the text. The tunability will then be controlled through the controller 50 shown in FIG. 1. The controller 50 may be configured to control LEDs 210 of the LED filament individually.

In the context of this invention, the LED filaments 20, 22, 24 of the lighting device 100 shown in FIG. 1 can be described as follows. FIG. 2 for example, demonstrates cross sectional views of such an LED filament 20, with vertical line cuts along the width (FIG. 2a), and the length (FIG. 2b) of the LED filament 20. The LEDs 210 are arranged on an elongated carrier 220, for instance a substrate. Please note that in this text the terms "carrier" and "substrate" may be used interchangeably, and unless stated otherwise, are meant to imply the same meaning. Preferably, the LED filament 20, 22, 24 has a length L and a width W, wherein L>5W. The width W of the LED filament 20, 22, 24 is preferably in the range of 3 to 10 mm, more preferably in the range of 4 to 8 mm, most preferably in the range of 5 to 7 mm. The obtained effect is improved mimicking a filament. The length L of the LED filament 20, 22, 24 is preferably longer than 30 mm, more preferably longer than 50 mm, most preferably longer than 100 mm. The obtained effect is improved mimicking a filament. The LED filament 20, 22, 24 is elongated having preferably an aspect ratio of the length L divided by the width W or height H of at least 10, more preferably at least 20, most preferably at least 30 such as for example 40 or 50. The LED filament 20, 22, 24 also has a height H. The height H of the LED filament is preferably in the range of 3 to 10 mm, more preferably in the range of 4 to 8 mm, most preferably in the range of 5 to 7 mm. The obtained effect is improved mimicking a filament. The LED filament 20, 22, 24 may be arranged in a straight configuration similar to FIG. 2b, or in a non-straight configuration such as for example a curved configuration, a 2D/3D spiral or a helix.

The LEDs 210 may be arranged in at least one linear array. The linear array in which the LEDs 210 are arranged, may be in the direction of the elongated carrier 220. The linear array is preferably a matrix of N×M LEDs 210, wherein N=1 (or 2, or 3) and M is at least 10, more preferably at least 15, most preferably at least 20 such as for example at least 30 or 36 LEDs 210.

The carrier 220 may be rigid (made from e.g. a polymer, glass, quartz, metal or sapphire) or flexible (e.g. made of a polymer e.g. a film or foil). A carrier 220 of rigid material may provide better cooling of the LED filament 20, meaning the heat generated by the LEDs 210 may be distributed by the rigid substrate 220. A carrier 220 of flexible material may provide shape freedom for designing the aesthetics of the LED filament 20, 22, 24 due to flexibility. It should be noted that, the thermal management of thin, flexible material may typically be poorer compared to rigid material. However, on the other hand, having rigid material as the substrate 220, may limit the shape design of the LED filament 20, 22, 24.

As shown in FIG. 2b, the carrier 220 may have a first major surface 222, and a second major surface 224. The LEDs 210 are arranged on at least one of these surfaces. In the embodiment demonstrated in FIG. 2b, and all of the following figures, the LEDs 210 are arranged on the first major surface 222 of the elongated carrier 220. The carrier 220 may be reflective or light transmissive, such as translucent and preferably transparent. The carrier 220 may have a thickness of $T_{subs}$.

According to this invention, the LED filament 20 may comprise a first elongated transparent layer 230, situated such to (at least partially) cover the LEDs 210, and at least partially cover the first major surface 222 of the carrier 220. This is demonstrated in the cross-sectional views of FIGS. 2a and 2b. A first elongated light scattering layer 240 is positioned so to cover the first transparent layer 230, such that the first transparent layer 230 is sandwiched between the carrier 220 and the first scattering layer 240. The normal maximum distance D between a light output surface 215 of the LED 210 and the first scattering layer 240 represents the optical path forward-emitted light from the LED 210 will traverse in the first transparent layer 230.

The combined effect of the first transparent layer 230 and the first scattering layer 240 is that they effectively provide for a mixing chamber, in which emitted light from the LEDs 210 in operation may be mixed. The scattering of light within the first scattering layer 240 may randomize the location from which light is emitted along the length L of the LED filament 20, hence providing a more homogeneous appearance of light exiting a first exiting surface 245 of the LED filament 20. Some light may be backscattered from the first scattering layer 240 towards the elongated carrier 220. In the case of the elongated carrier 220 being transparent, the back scattered light may traverse the volume of the carrier 220 and exit the filament from the second major surface 224.

FIG. 3 demonstrates cross sectional views of another embodiment of the LED filament 22 according to this invention, with vertical line cuts along the width, and the length (FIGS. 3a and 3b respectively). In the embodiment depicted in this figure, the LED filament 22 comprises a second elongated transparent layer 260 positioned to (at least partially) cover the second major surface 224 of the elongated carrier 220, and a second elongated light scattering layer 250 positioned so to (at least partially) cover said second elongated transparent layer 260. The second elongated transparent layer 260 has a thickness of $T_2$. The combined effect of the second transparent 260 and scattering 250 layers, is to effectively provide for a mixing chamber in which back scattered light from the first scattering layer 240, and side-emitted light from the LEDs 210 can be mixed, so to provide for a more homogeneous appearance for light exiting a second exit surface 255 of the LED filament 22. In this embodiment the carrier 220 should be light transparent, otherwise providing a mixing chamber on the second major surface 224 of the carrier 220 will be redundant. The second transparent layer 260 has a thickness of $T_2$. Preferably D is larger than $T_2$. This is to provide for a more optimal all-around light distribution from the LED filament 22. Also, the maximum normal distance $P_1$ from the first major surface 222 of the elongated carrier 220 to the exterior surface of the first elongated light scattering layer 240 may be at least 1.5 times the maximum normal distance $P_2$ from the second major surface 224 of the elongated carrier 220 to the exterior surface of the second elongated light scattering layer 250.

The transparent layers 230, 260, and the scattering layers 240, 250 can be applied by suspending/printing techniques. For instance, the layers 230, 240, 250, 260 can be applied by dip coating or spraying techniques onto the carrier 220 on which the LEDs 210 are arranged on. The transparent layers 230, 260, and the scattering layers 240, 250 are preferably flexible, and are preferably Silicone materials.

The scattering properties of the scattering layers 240, 250 may be achieved by through the inclusion of light scattering particles 242, 252 in these layers.

Figure 4A:
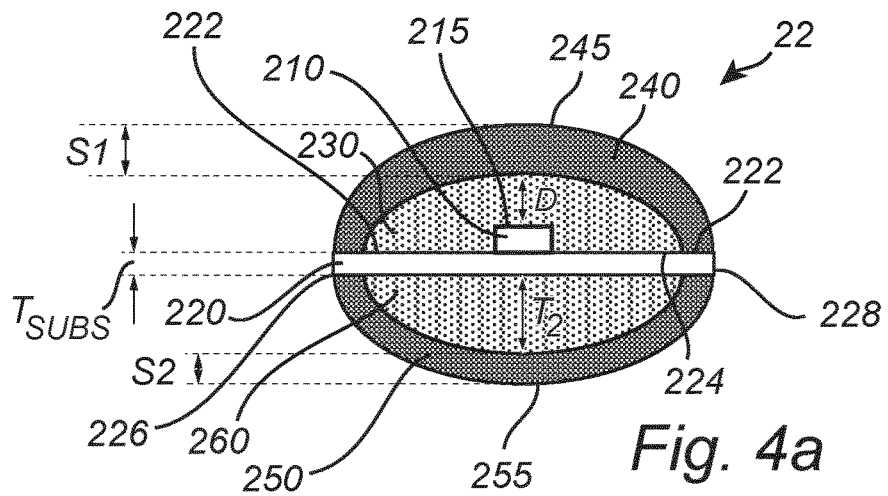
FIGS. 4a and 4b demonstrate different embodiments of the scattering layer of the LED filament.
Figure 4B:
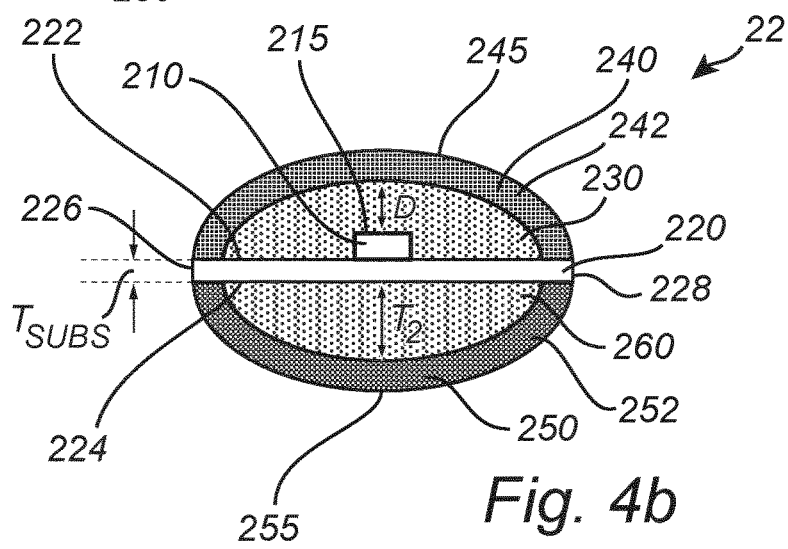

Furthermore, the scattering of the first scattering layer 240 is preferably higher than that of the second scattering layer 250. That is for further improving the light mixing of forward-emitted light exiting the first exiting surface 245 and the back scattered and/or side-emitted light from the second exiting surface 255, so that they have a similar distribution, leading to an improved symmetry. FIG. 4 depicts exemplifying embodiments of an LED filament 22 in which the first scattering layer 240 is relatively more scattering than the second scattering layer 250. In FIG. 4a the thickness S1 of the first scattering layer 240 is generally larger than the thickness S2 of the second scattering layer 250. By this the optical path through which forward-emitted light is required to traverse through the first scattering layer 240 is increased, so that consequently the average number of scattering events will be increased in comparison to light traversing the second scattering layer 250. In FIG. 4b, the density and/or material of the scattering particles 242, and 252 of the first 240 and second 250 scattering layers are different. The density and/or material comprising the scattering particles 242 of the first scattering layer 240 is higher compared to the scattering particles 252 of the second scattering layer 250. This may insure an increase in the average number of scattering events light may encounter in the first scattering layer 240 compared to that of the second scattering layer 250. It is additionally noted that in the embodiment of FIG. 4b, S1 and S2 may be uniform.

A first side surface 226 and a second side surface 228 of the elongated carrier 220 of the embodiments depicted in FIGS. 1-4 are bare. It is noted that some of the light traversing through the thickness $T_{subs}$ of the carrier 220 may escape through these first 226 and second 228 side surfaces. As mentioned, light may be mixed within the volume of the transparent elongated carrier 220, and additionally in the second transparent layer 260 in embodiments comprising a second transparent layer 260 (embodiments of FIGS. 2-4), where the transparent elongated carrier 220 may be optically considered as a portion of the second transparent layer 260. Additionally, for ensuring a better all-around light distribution from the filament 20 it may be useful that the first 226 and second 228 side surfaces of the carrier 220 are also covered by a scattering layer.

Figure 5:
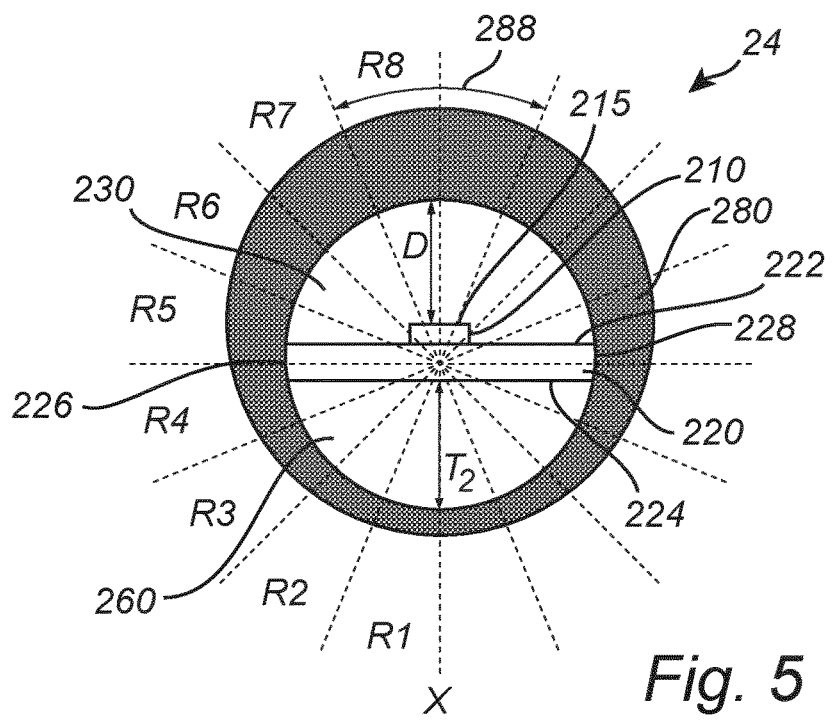
FIG. 5 demonstrates an embodiment of the LED filament with a single all-around scattering layer.

In the embodiment of the LED filament 24 depicted in the radial cross-sectional view of FIG. 5, the first 226 and second 228 side surfaces of the carrier 220 are covered by a scattering layer 280. In this embodiment, the first scattering surface 240 and the second scattering surface 250 are merged so to form a single, all-around scattering layer 280, which circumferentially encompasses the rest of the LED filament 24. In the embodiment of FIG. 5, the scattering property of the all-around scattering layer 280 may differ from portion to portion in an angular gradient manner. This again, is to further improve the even all-around light distribution from the filament 24. The portion 228 of the all-around scattering layer 280 which is substantially parallel to the elongated carrier 220/light output surface 215 of the LED 210, has the highest scattering effect so to compensate for the higher intensity of the direct-emitted light from the LEDs 210, emitted in a direction substantially normal to that of the output surface 215 of the LEDs 210. Following the same reasoning, and as shown in the embodiment of FIG. 5, the angular scattering gradient of the single all-around scattering layer 280 is accomplished by a gradual change in the thickness of this scattering layer 280. In addition, in the embodiment shown in FIG. 5, the thickness, hence scattering properties of the all the single all-around scattering layer 280, has a mirrored symmetry around an axis X normal to the length of the elongated carrier 220.

The reflectivity, hence scattering, may be equal, and the lowest in portions R1-R4 of the single all-around scattering layer 280. The latter mentioned portions, together with their mirrored portions, position-wise largely correspond to that of the second scattering layer 250 of the previous embodiments, and therefore is in no need of a gradient in scattering effects. These portions have a reflectivity of preferably less than 30%, more preferably less than 25%, most preferably less than 20%.

The reflectivity of portions R5-R8 have are higher than that of R1-R4, and have an increasing gradient in their reflectivity as follows: R5<R6<R7<R8. These portions together with their mirrored portions position-wise largely correspond with that of the first scattering layer 240 of the previous embodiments, therefore are required to have a relatively higher scattering effect compared to R1-R4. Portion R8 has the highest reflectivity being preferably more than 50%, more preferably more than 60%, most preferably more than 70%.

The all-around scattering layer 280 can be referred to as a diffuser. The scattering layer (diffuser) 280 can be made e.g. by dispensing, or a (shrink) tube.

Figure 6A:
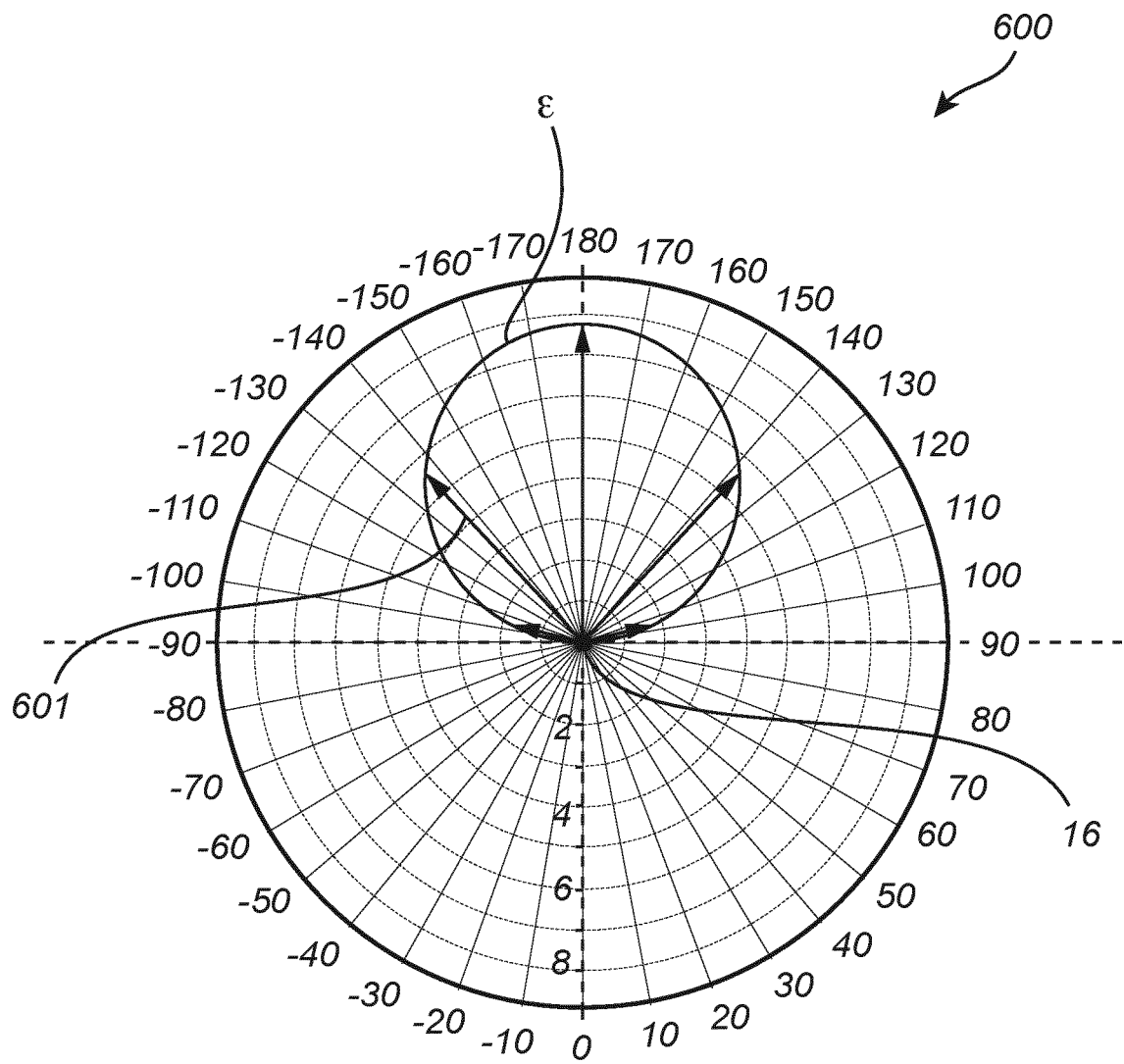
FIGS. 6a-6c demonstrate the light distribution of LED filaments with and without the present inventive concept.
Figure 6B:
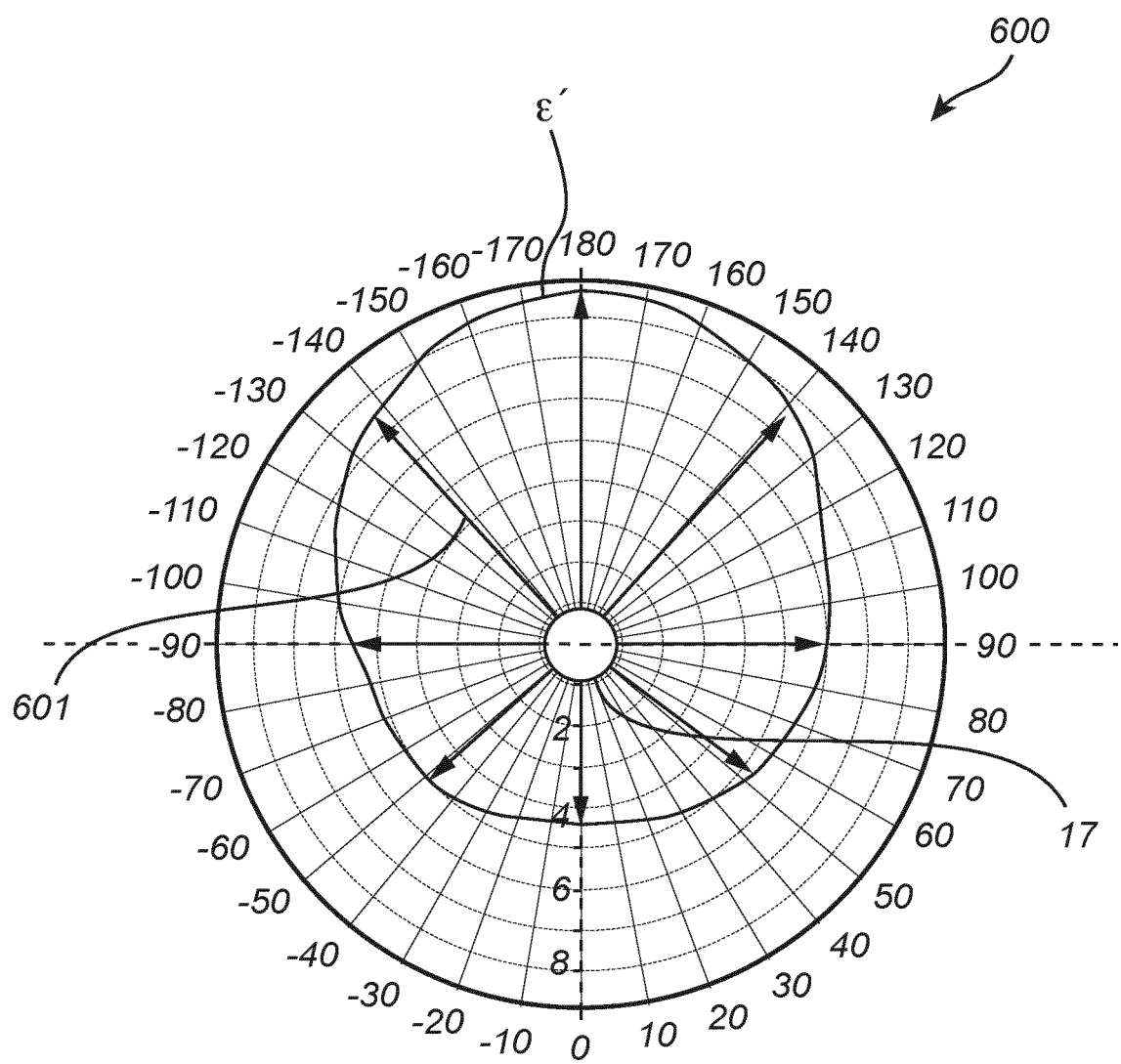
Figure 6C:
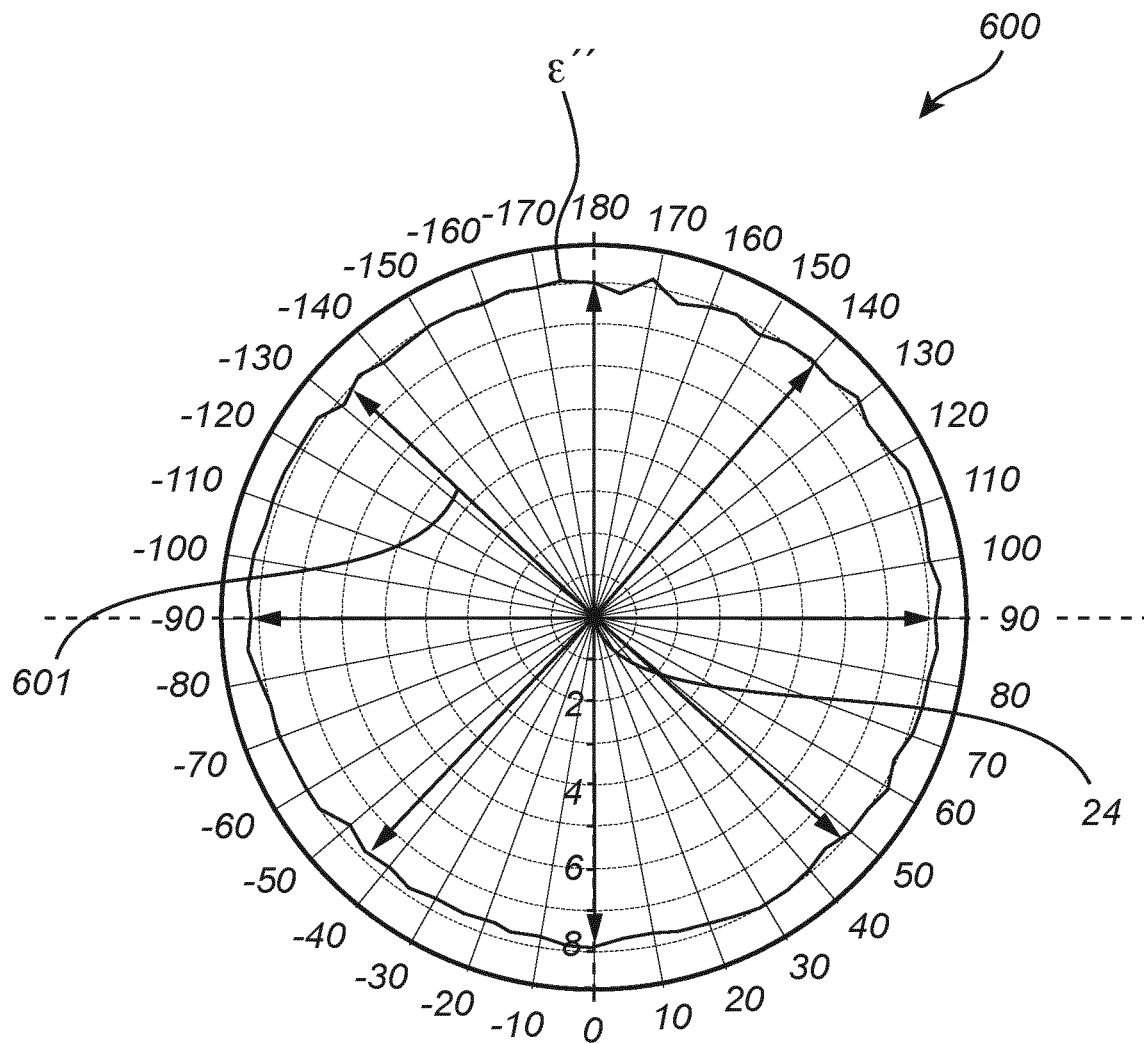

FIGS. 6a through 6c shows a schematic comparison of the light distribution resulting from different LED filaments. The filaments 16, 17, and 24 are perpendicular to the plane of the page, at the center of the graph 600. FIG. 6a depicts the light distribution E of a conventional LED filament 16 in which the carrier is reflective, thus light cannot traverse the carrier. As seen from the emission vectors 601, and the envelope light distribution E, light emitted from this LED is non-homogeneous, being less bright on the sides as opposed to the top, and is solely emitted from the first exiting surface. In FIG. 6b light distribution E' from a filament 17 which comprises a light transmissive carrier, and light scattering layers directly on both sides of the light transmissive carrier, is shown. As observable from the emission vectors 601, and the envelope light distribution E', even though there is some emission from the backside of the filament 17, the overall distribution is heterogeneous and non-symmetrical. This is due poor light mixing of the filament 17. FIG. 6c demonstrates light distribution E" from a filament 24 according to the invention with the all-around light scattering layer (diffuser) 280. As observable from the graph 600, the light distribution E" of the filament with the diffuser is substantially homogeneous, with an all-around symmetrical light distribution.

FIG. 7 demonstrates embodiments of the LED filament 20, 22, 24 on which the LEDs 212, 214, 216, 218, 219 are arranged in different configurations. FIGS. 7a and 7b depict a portion of the elongated carrier 220, in which R 212, G 214, and B 216 LEDs are arranged on the first major surface 222 of the carrier 220. In FIG. 7a, The R 212, G 214, and B 216 LEDs are arranged in three linear arrays: the R channel 12, the G channel 14, and the B channel 16 which are parallel and individually addressable, each contain the R 212, G 214, and B 216 LEDs respectively. (Each of the R 12, G 14, and B 16 channels may be addressed individually, and/or simultaneously.)

Figure 7A:
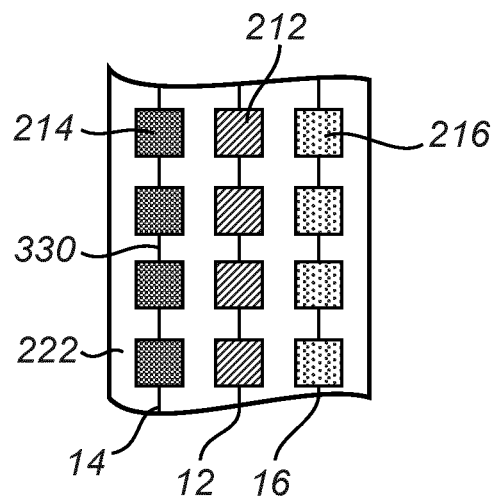
FIGS. 7a-7d demonstrate different embodiments of the carrier of the LED filament on which different types of LEDs are arranged in various configurations.
Figure 7B:
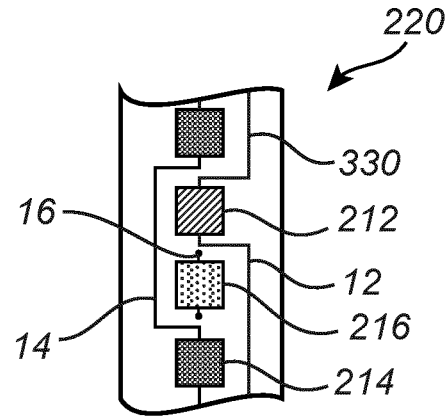

FIG. 7b illustrates a portion of the carrier 220 in which the R 212, the G 214, and the B 216 LEDs are arranged alternately in a single linear array on the first major surface 222, wherein the G LEDs 214 provide a green channel 14, wherein R LEDs 212 provide a red channel 12, wherein the B LEDs 216 provide a blue channel 16. The in order to have separate color channels, the R 212, G 214, and B 216 LEDs may be connected using jumpers or a double Cu layer 330 for connecting the same color LEDs to on another. Due to all LEDs being width-wise centrally arranged within the body of the filament 20, 22, 24, and with respect to the transparent layer(s) 230, 260, and the scattering layer(s) 240, 250, this embodiment may further improve color mixing. Again, each of the R, G, and B channels 12, 14, 16 may be addressed individually, and/or simultaneously.

Figure 7C:
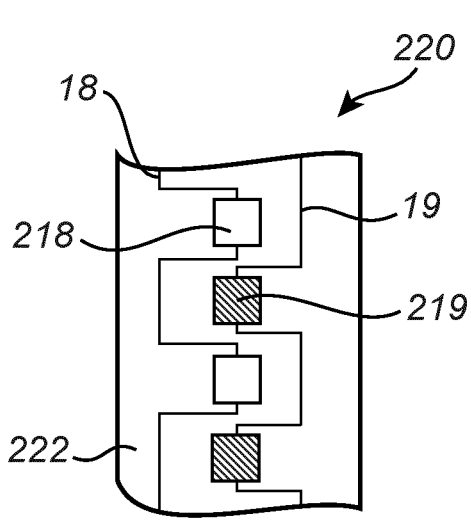

FIG. 7c depicts a portion of the carrier 220 in which cool-white (color) 218, and warm-white (color) 219 LEDs arranged alternately in a single linear array. In this embodiment the warm white LEDs 219 provide a warm white channel 19, and the cool-white LEDs 218 provide a cool-white channel 18, such that these channels 18, 19 are individually addressable, so to provide for color temperature tunability.

Figure 7D:
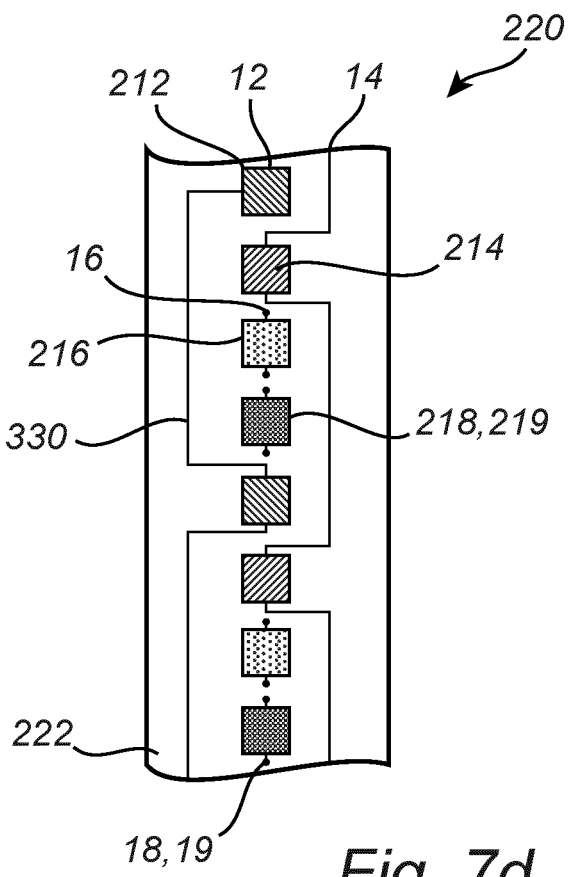

FIG. 7d illustrates an embodiment in which the plurality of LEDs include red LEDs 212, green LEDs 214, blue LEDs 216, and white (e.g. cool or warm) LEDs 217 arranged alternately in a single linear array.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:
1. A color tunable and/or color temperature tunable light emitting diode, LED, filament, said LED filament comprising:
an elongated carrier, said elongated carrier comprising a first major surface and a second major surface arranged opposite to said first major surface,
a plurality of LEDs arranged in at least one linear array on said first surface of said elongated carrier, wherein the plurality of LEDs includes LEDs of different colors and/or different color temperatures,
a first elongated transparent or substantially transparent layer covering the plurality of LEDs on the first major surface and also at least partly covering said first major surface, and a first elongated light scattering layer, arranged to at least partially cover said first transparent or substantially transparent layer, wherein said second major surface of the elongated carrier is at least partially covered by a second elongated light scattering layer, and wherein said first elongated light scattering layer has a higher reflectance than said second elongated light scattering layer.

2. The LED filament according to claim 1, wherein said second major surface of the elongated carrier is at least partially covered by a second elongated transparent or substantially transparent layer, said second elongated transparent or substantially transparent layer having a thickness ($T_2$), and wherein a second elongated light scattering layer is arranged to at least partially cover said second elongated transparent or substantially transparent layer.

3. The LED filament according to claim 1, wherein said elongated carrier is translucent, preferably transparent.

4. The LED filament according to claim 1, wherein a maximum distance (D) between a light output surface of the plurality of LEDs and the first elongated light scattering layer, is in the range of 0.5 to 5 mm, preferably in the range from 0.8 to 4 mm, and more preferably in the range from 1 to 3 mm.

5. The LED filament according to claim 1,
wherein the plurality of LEDs includes green LEDs, red LEDs, and blue LEDs, wherein the plurality of LEDs are arranged in three linear arrays which are parallel and individually addressable, and wherein one of the three parallel and linear arrays contains the green LEDs, another one of the three parallel and linear arrays contains the red LEDs, and a third of the three parallel and linear arrays contains the blue LEDs; or
wherein the plurality of LEDs includes green LEDs, red LEDs, and blue LEDs arranged alternately in a single linear array, wherein the green LEDs provide a green channel, wherein red LEDs provide a red channel, wherein the blue LEDs provide a blue channel, and wherein the green, red and blue channels are individually addressable.

6. The LED filament according to claim 1, wherein the plurality of LEDs includes cool white LEDs and warm white LEDs arranged alternately in a single linear array, wherein the cool white LEDs provide a cool white channel, wherein the warm white LEDs provide a warm white channel, and wherein the cool white and warm white channels are individually addressable.

7. The LED filament according to claim 1, wherein the first elongated light scattering layer has a reflectance in the range of 30% to 90%, preferably in the range of 50% to 90%, and more preferably in the range of 60% to 90%.

8. The LED filament according to claim 1, wherein the first elongated light scattering layer has an angular gradient in reflectance such that the reflectance is highest in a portion (R8) of the first elongated light scattering layer being substantially parallel to said first major surface of the elongated carrier.

9. The LED filament according to claim 2, wherein the second elongated light scattering layer has a reflectance in the range of 8% to 35%, preferably in the range of 10% to 32%, and more preferably in the range of 12 to 30%.

10. The LED filament according to claim 1, wherein said first elongated light scattering layer and said second elongated light scattering layer form a single all-around light scattering layer.

11. The LED filament according to claim 2, wherein said maximum distance (D) is greater than the thickness ($T_2$) of the second elongated transparent or substantially transparent layer.

12. The LED filament according to claim 1, wherein a maximum normal distance $P_1$ from the first major surface of the elongated carrier to the exterior surface of the first elongated light scattering layer is at least 1.5 times the maximum normal distance $P_2$ from the second major surface of the elongated carrier to the exterior surface of the second elongated light scattering layer.

13. A retrofit light bulb, comprising at least one LED filament according to claim 1, a transmissive envelope at least partly surrounding said LED filament(s), a controller electrically connected to the at least one LED filament, and a connector for electrically and mechanically connecting said light bulb to a socket.

* * * * *